(12) United States Patent
Hohlfeld

(10) Patent No.: US 9,609,748 B2
(45) Date of Patent: Mar. 28, 2017

(54) SEMICONDUCTOR MODULE COMPRISING PRINTED CIRCUIT BOARD AND METHOD FOR PRODUCING A SEMICONDUCTOR MODULE COMPRISING A PRINTED CIRCUIT BOARD

(71) Applicant: Infineon Technologies AG, Neubiberg (DE)

(72) Inventor: Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 245 days.

(21) Appl. No.: 14/500,041

(22) Filed: Sep. 29, 2014

(65) Prior Publication Data

US 2015/0092380 A1    Apr. 2, 2015

(30) Foreign Application Priority Data

Sep. 30, 2013   (DE) .................. 10 2013 219 833

(51) Int. Cl.
*H05K 7/00* (2006.01)
*H05K 1/11* (2006.01)
(Continued)

(52) U.S. Cl.
CPC ............... *H05K 1/11* (2013.01); *H05K 1/141* (2013.01); *H05K 1/181* (2013.01); *H05K 3/10* (2013.01); *H05K 3/32* (2013.01); *H05K 3/368* (2013.01); *H05K 3/4697* (2013.01); *H01L 2224/0603* (2013.01); *H01L 2224/32225* (2013.01);
(Continued)

(58) Field of Classification Search
CPC ....... H01L 2924/00; H01L 2224/48227; H01L 2224/32225; H01L 2224/48472; H01L 2224/73265; H01L 2924/13055; H01L 2924/181; H01L 2924/00012; H01L 2224/0603; H01L 2224/4846; H01L 2224/49111; H05K 1/11
See application file for complete search history.

(56) References Cited

U.S. PATENT DOCUMENTS 4,524,238 A    6/1985   Butt
4,784,974 A    11/1988  Butt
(Continued)

FOREIGN PATENT DOCUMENTS

CN    101848773 A    9/2010
JP    2003282751 A   10/2003

*Primary Examiner* — Yuriy Semenenko
(74) *Attorney, Agent, or Firm* — Murphy, Bilak & Homiller, PLLC

(57) ABSTRACT

A semiconductor module includes a printed circuit board, a ceramic substrate and a semiconductor chip. The printed circuit board includes an insulating material, a cutout formed in the insulating material, and a first metallization layer, which is partly embedded into the insulating material. The first metallization layer includes a conductor track projection projecting into the cutout. The ceramic substrate includes a dielectric, ceramic insulation carrier, and an upper substrate metallization applied to a top side of the insulation carrier. The semiconductor chip is arranged on the upper substrate metallization, and the first metallization layer is mechanically and electrically conductively connected to the upper substrate metallization at the conductor track projection.

21 Claims, 14 Drawing Sheets

(51) Int. Cl.
  *H05K 1/18*    (2006.01)
  *H05K 3/10*    (2006.01)
  *H05K 3/32*    (2006.01)
  *H05K 1/14*    (2006.01)
  *H05K 3/36*    (2006.01)
  *H05K 3/46*    (2006.01)
  *H05K 3/00*    (2006.01)
  *H05K 3/40*    (2006.01)

(52) U.S. Cl.
  CPC .............. *H01L 2224/4846* (2013.01); *H01L 2224/48227* (2013.01); *H01L 2224/48472* (2013.01); *H01L 2224/49111* (2013.01); *H01L 2224/73265* (2013.01); *H01L 2924/13055* (2013.01); *H01L 2924/181* (2013.01); *H05K 1/184* (2013.01); *H05K 3/0061* (2013.01); *H05K 3/4092* (2013.01); *H05K 2201/10409* (2013.01); *Y10T 29/41* (2015.01)

(56) References Cited

U.S. PATENT DOCUMENTS

| | | | | |
|---|---|---|---|---|
| 2009/0096503 | A1* | 4/2009 | Koellensperger | H01L 23/051 327/440 |
| 2012/0326337 | A1* | 12/2012 | Camacho | H01L 24/19 257/782 |
| 2014/0218883 | A1* | 8/2014 | Dakhiya | H01L 23/5384 361/761 |
| 2014/0264817 | A1* | 9/2014 | Lee | H01L 25/0657 257/712 |
| 2014/0291001 | A1* | 10/2014 | Lin | H01L 23/3121 174/261 |

\* cited by examiner

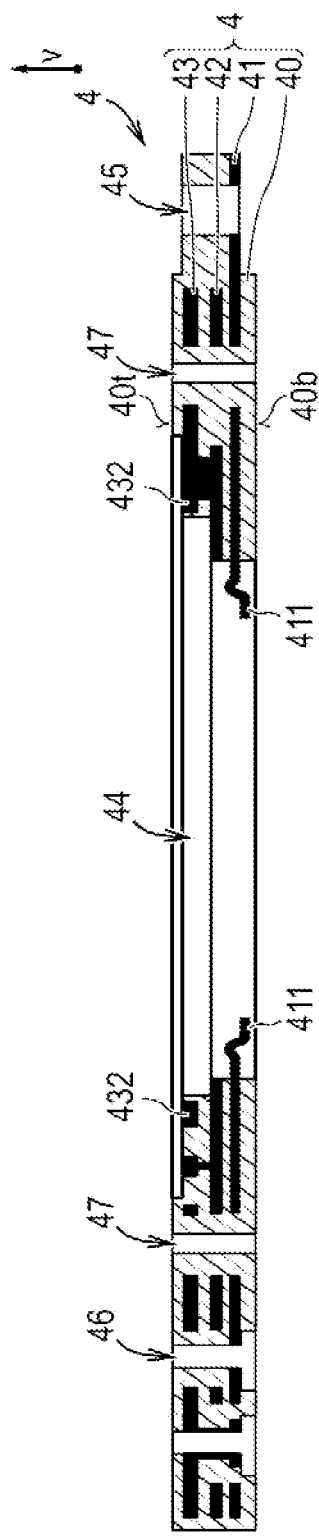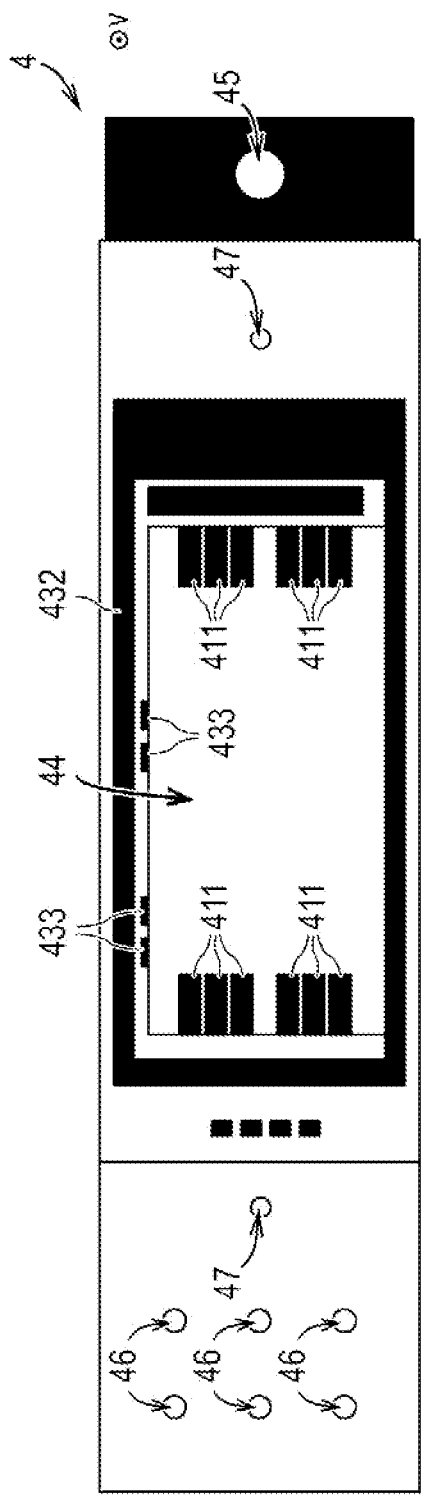

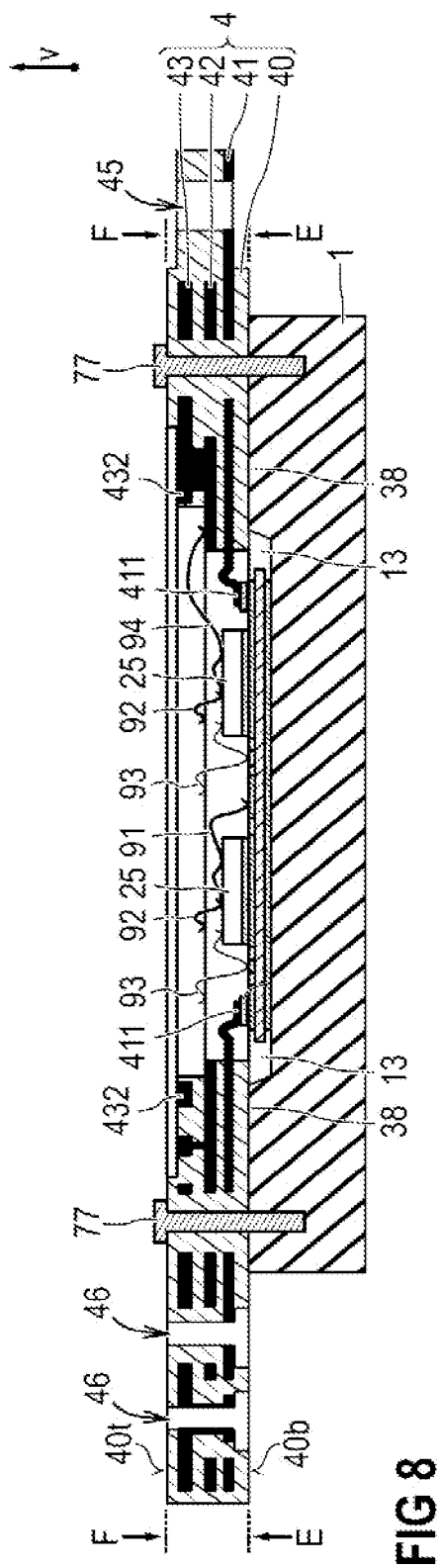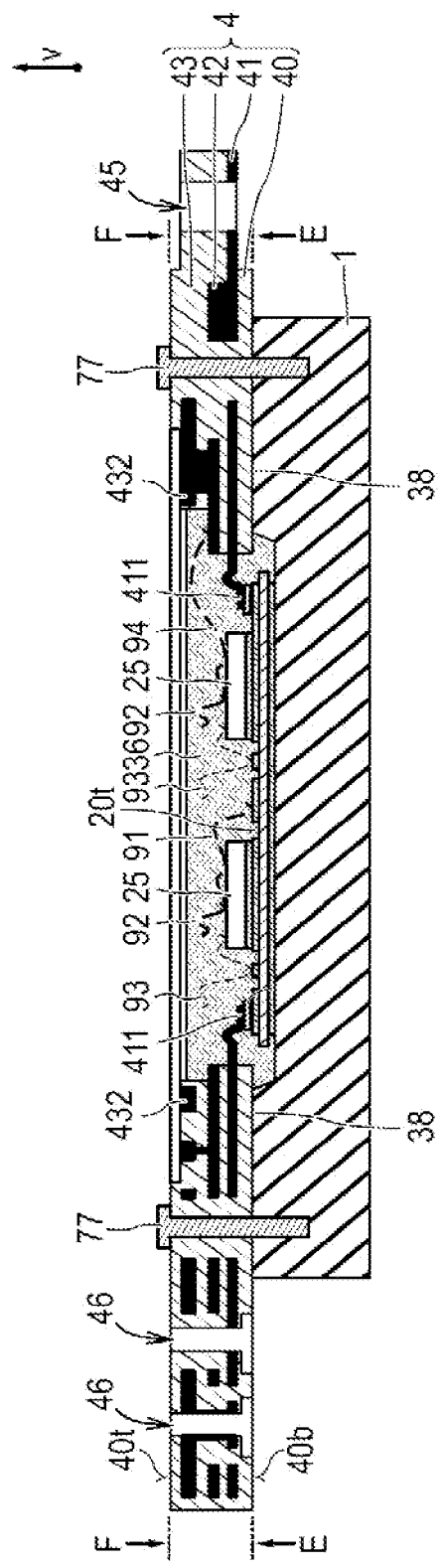

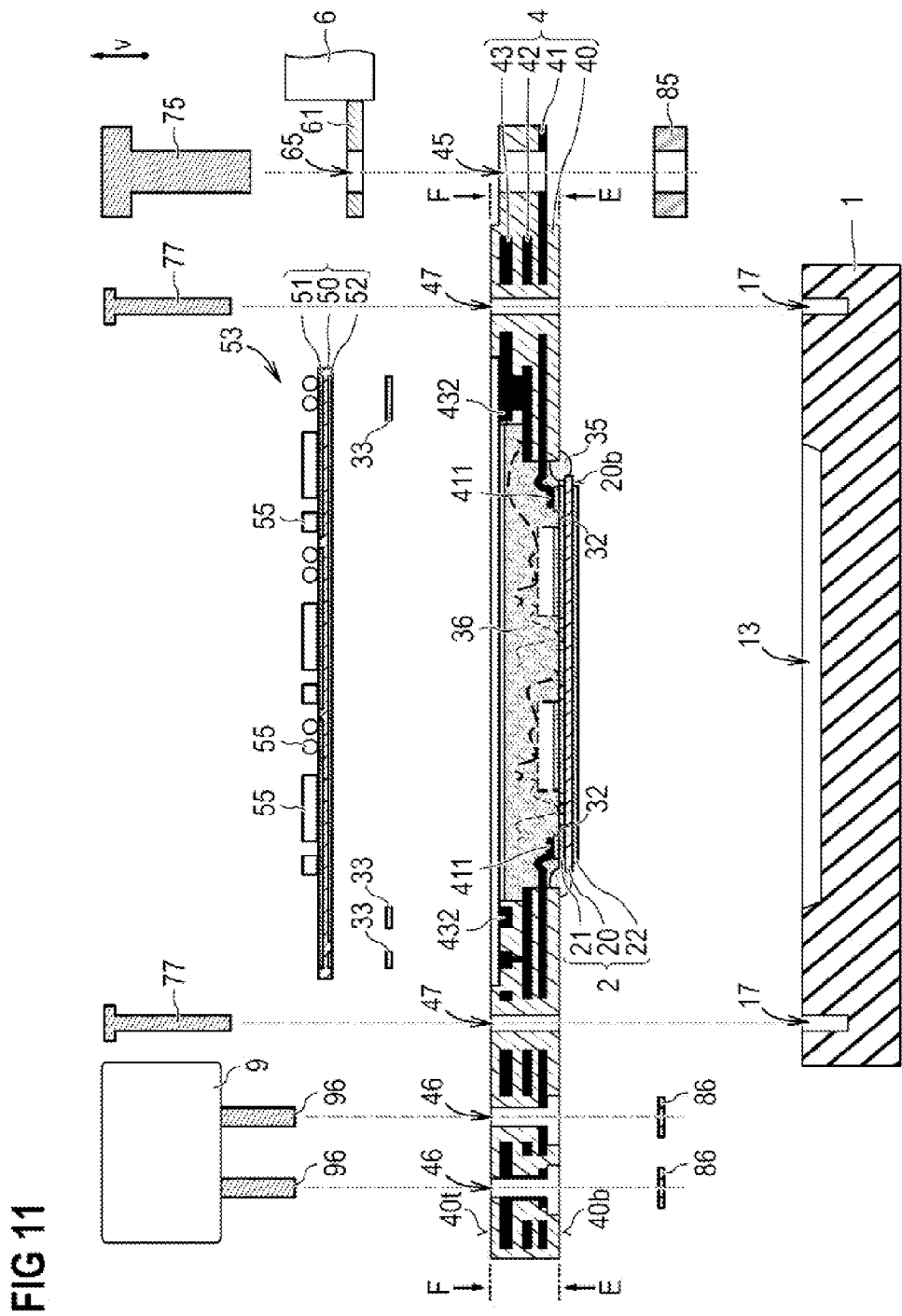

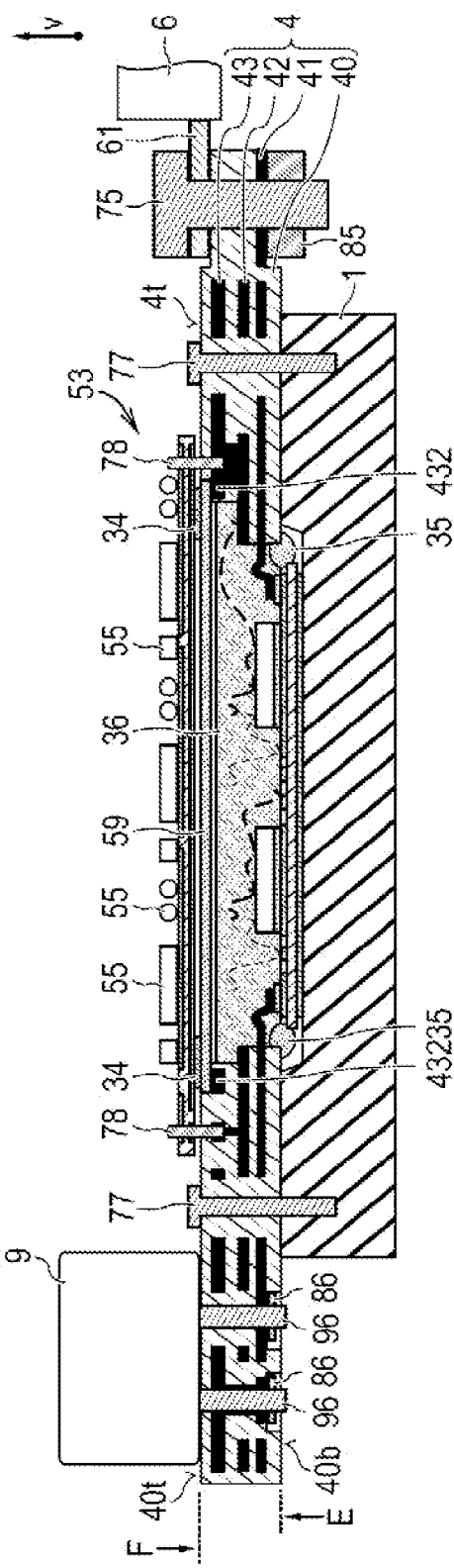
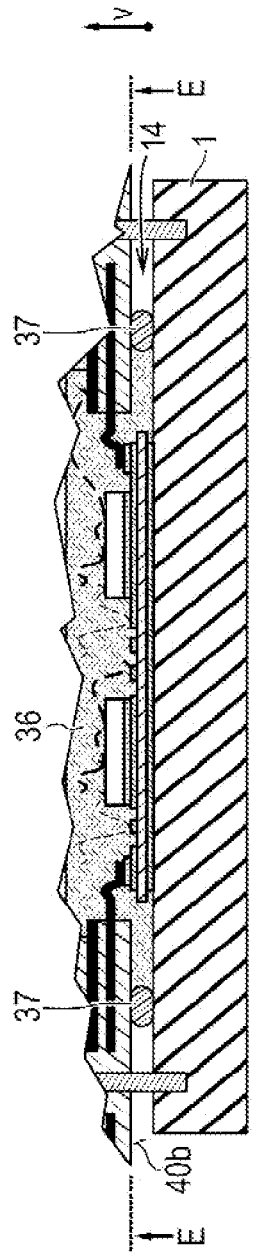
FIG 14
FIG 15

SEMICONDUCTOR MODULE COMPRISING PRINTED CIRCUIT BOARD AND METHOD FOR PRODUCING A SEMICONDUCTOR MODULE COMPRISING A PRINTED CIRCUIT BOARD

PRIORITY CLAIM

This application claims priority to German Patent Application No. 10 2013 219 833.7, filed on 30 Sep. 2013, the content of said German application incorporated herein by reference in its entirety.

TECHNICAL FIELD

The present invention relates to semiconductor modules.

BACKGROUND

Many conventional semiconductor modules comprise a prefabricated housing produced using injection-molding technology and embodied as a housing frame in which the semiconductor chips are arranged. In this case, the interior of the housing frame can be potted with a silicone potting compound. Such prefabricated semiconductor modules are often mounted on high-current printed circuit boards for further interconnection. Optionally, a driver circuit board for driving the semiconductor chips situated in the semiconductor module can then also be fitted on the high-current printed circuit board. The semiconductor module and the high-current printed circuit board are firstly produced independently of one another and only later connected to one another.

In other conventional semiconductor modules, the semiconductor chips are incorporated directly into the printed circuit board. For this purpose, the printed circuit board manufacturer has to carry out the connection of the semiconductor chips to the printed circuit board, but said manufacturer normally cannot have recourse to the requisite experience, which, however, is absolutely necessary for the production of high-quality connections owing to the semiconductor chips usually having a large area. Alternatively, the connection between the semiconductor chips and the printed circuit board can also be carried out by the manufacturer of the semiconductor module. In that case, however, the printed circuit board has to be sent back to the printed circuit board manufacturer for further processing with the unprotected semiconductor chips situated on it, one or more prepreg layers being additionally applied, for example, by said manufacturer. Moreover, the terminals of the semiconductor chips that have not yet been connected to the printed circuit board have to be electrolytically coated in order to enable the semiconductor chips to be contact-connected to a further metallization layer of the printed circuit board that is to be applied. During the processing of the partly finished printed circuit board already populated with the semiconductor chip by the printed circuit board manufacturer, however, there is the risk of damage to the unprotected semiconductor chips. Moreover, applying an electrolytic coating to terminals of the semiconductor chips already mounted on the partly finished printed circuit board is very expensive on account of the required deposition thicknesses.

A further problem area is that the semiconductor chips can have very high heat densities, for example up to 200 W/cm$^2$, such that the heat that arises is dissipated only to an insufficient extent on account of the low thermal conductivity of the epoxy resins used in printed circuit board technology (typically <1 W/mK).

SUMMARY

A semiconductor module and a method for producing a semiconductor module which has a simple and thus cost-effective construction is provided, and in the case of which the heat loss arising in the semiconductor chips can be dissipated well.

A semiconductor module comprises a printed circuit board and a ceramic substrate. The printed circuit board comprises an insulating material, a cutout formed in the insulating material, and a first metallization layer, which is partly embedded into the insulating material and which has a conductor track projection projecting into the cutout. In this case, the first metallization layer can optionally be detached from the insulating material in the entire region of the conductor track projection. The ceramic substrate contains a dielectric, ceramic insulation carrier, and an upper substrate metallization, which is applied to a top side of the insulation carrier. A semiconductor chip is arranged on the upper substrate metallization and thus also on the ceramic substrate. The first metallization layer is electrically conductively connected to the upper substrate metallization at the conductor track projection.

A method for producing a semiconductor module involves providing a printed circuit board and a ceramic substrate. The printed circuit board comprises an insulating material, a cutout formed in the insulating material, and a first metallization layer, which is partly embedded into the insulating material and which comprises a conductor track projection projecting into the cutout. A ceramic substrate is likewise provided, comprising a dielectric ceramic insulation carrier, and an upper substrate metallization applied to a top side of the insulation carrier. The ceramic substrate is equipped with a semiconductor chip arranged on the upper substrate metallization. An electrically conductive connection is produced between the first metallization layer and the upper substrate metallization by means of the first metallization layer being electrically conductively connected to the upper substrate metallization at the conductor track projection.

The present invention therefore provides for a conductor track projection of a conductor track of the printed circuit board, which conductor track projection projects into a cutout of the printed circuit board, to be connected to an upper substrate metallization of the ceramic substrate. This affords the possibility of arranging the semiconductor chip completely or partly in the cutout, such that the printed circuit board forms a housing in which the semiconductor chip is arranged.

Within the meaning of the present invention, an "upper substrate metallization" is arranged above the top side of the insulation carrier. It can be, but need not necessarily be, the topmost substrate metallization of the substrate.

Such a semiconductor module therefore comprises a composite assembly having a printed circuit board and a ceramic substrate equipped with a semiconductor chip. As a result of the arrangement of the semiconductor chip, heat loss arising in the semiconductor chip during the operation of the semiconductor module can be dissipated excellently via the ceramic substrate, since ceramics have a significantly higher thermal conductivity than conventional printed circuit boards based on epoxy resin.

Furthermore, the ceramic substrate is mounted movably relative to the printed circuit board on account of its mounting on one or a plurality of conductor track projections, with the result that said ceramic substrate is pressed in the direction of the cutout when the printed circuit board is mounted on a heat sink, the conductor track projection or projections being prestressed and bringing about a contact-pressing force of the ceramic substrate in the direction of the heat sink.

A printed circuit board within the meaning of the present invention can optionally be a high-current printed circuit board, i.e. a printed circuit board in which at least one conductor track formed in one of the metallization layers of the printed circuit board has a thickness of at least 105 µm. Particularly the upper metallization layer can have, but need not necessarily have, a thickness of at least 105 µm.

In the case of the present invention, a composite assembly comprising a ceramic substrate and the semiconductor chip can be arranged at least partly in the cutout of the printed circuit board.

Those skilled in the art will recognize additional features and advantages upon reading the following detailed description, and upon viewing the accompanying drawings.

BRIEF DESCRIPTION OF THE DRAWINGS

The invention is explained below on the basis of exemplary embodiments with reference to the accompanying figures, in which:

FIG. 2A shows a vertical section through the printed circuit board in accordance with FIG. 1.

FIG. 2B shows a plan view of the printed circuit board in accordance with FIG. 2A.

FIG. 7 shows the arrangement in accordance with FIG. 6A after the mounting thereof on a heat sink.

FIG. 8 shows the arrangement in accordance with FIG. 7 after a potting compound has been filled at least into the cutout.

FIG. 11 shows the arrangement in accordance with FIG. 10A with further optional components.

FIG. 14 shows a further configuration of a semiconductor module arrangement, wherein the cutout of the printed circuit board is covered by an electrically conductive cover, which is electrically conductively connected to a conductor track of the printed circuit board.

FIG. 15 shows a configuration of a semiconductor module comprising a heat sink mounted on the printed circuit board, and wherein a gap between the printed circuit board and the heat sink is sealed by means of a sealing ring.

DETAILED DESCRIPTION

The features explained on the basis of the different exemplary embodiments can be combined with one another in any desired manner, unless indicated otherwise or provided that a combination of different features with one another is not technically precluded.

Figure 1:
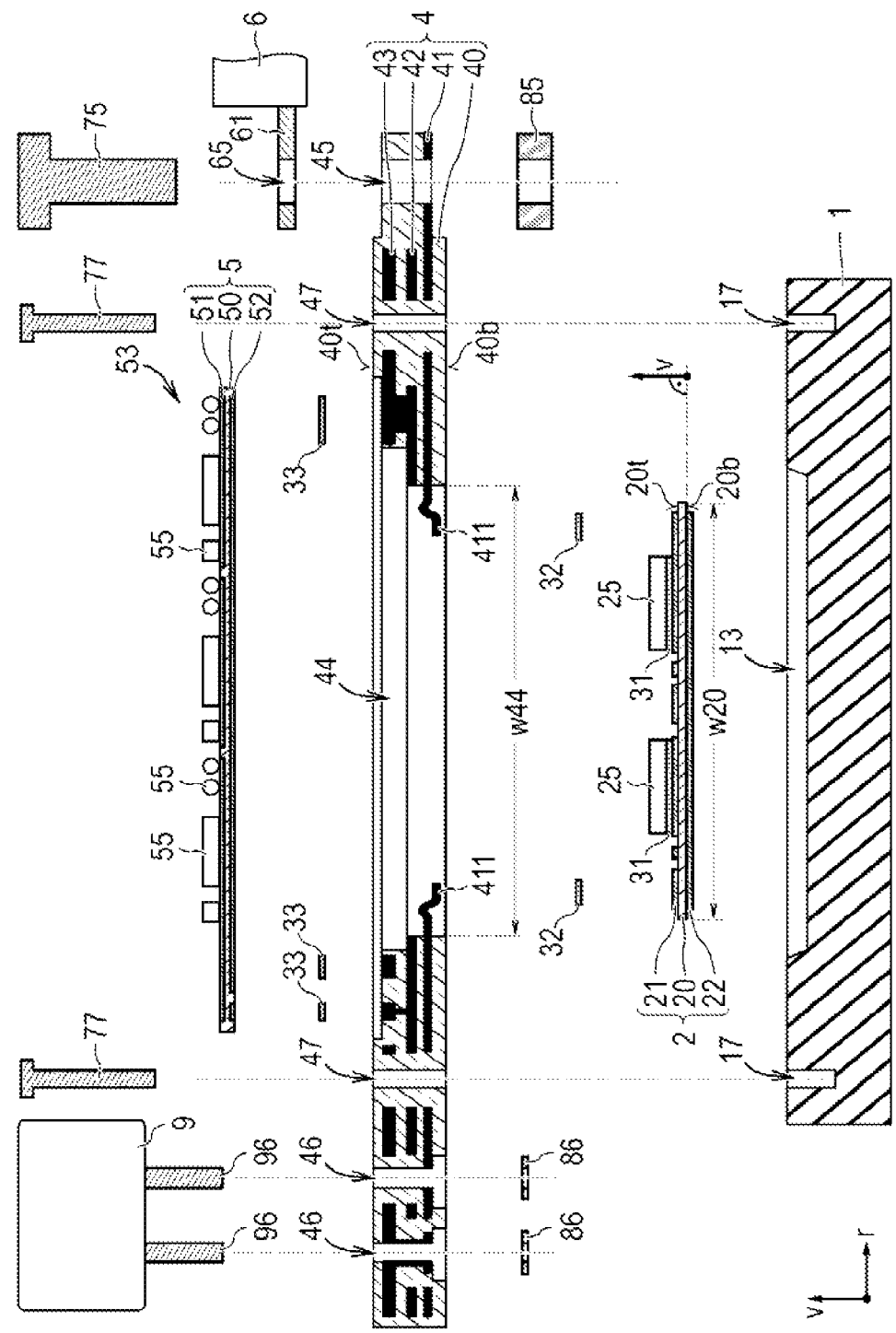
FIG. 1 shows an exploded illustration of an arrangement comprising a semiconductor module according to the present invention, and comprising further optional components.

FIG. 1 shows an exploded illustration of a semiconductor module arrangement. The arrangement comprises a ceramic substrate 2 equipped with one or a plurality of semiconductor chips 25, and a printed circuit board 4. All further components illustrated are, independently of one another, optional in each case. The semiconductor chip or semiconductor chips 25 can be for example MOSFETs, IGBTs, junction field effect transistors, thyristors, diodes or any other semiconductor components.

The ceramic substrate 2 comprises a dielectric ceramic insulation carrier 20 having a top side 20$t$ and an underside 20$b$ opposite to the top side. The insulation carrier 20 can be embodied for example as a flat ceramic lamina in which the top side 20$t$ and the underside 20$b$ constitute the sides having the largest areas.

The insulation carrier 20 can be for example a flat, planar ceramic lamina. Examples of suitable ceramic materials are aluminum nitride (AlN), aluminum oxide ($Al_2O_3$), silicon nitride ($Si_3N_4$), silicon carbide (SiC) or beryllium oxide (BeO).

The ceramic substrate 2 furthermore comprises an upper substrate metallization 21 applied to the top side 20$t$ and an optional lower substrate metallization 22 applied to the underside 20$b$. The upper substrate metallization 21 can be unstructured or—as illustrated—structured to form conductor tracks having in principle any desired course. The lower substrate metallization can also be constructed or—as illustrated—unstructured. Furthermore, the upper substrate metallization 21 can be electrically insulated from the lower substrate metallization 22 by the ceramic insulation carrier 20.

In this case, as already explained, the vertical direction v runs in a direction perpendicular to the underside 20b of the ceramic insulation carrier 20 from the underside 20b to the top side 20t.

The upper substrate metallization 21 and/or the lower substrate metallization 22 can comprise copper or consist of copper, or of a copper alloy comprising a high proportion of copper. Likewise, the upper substrate metallization 21 and/or the lower substrate metallization 22 can comprise aluminum or consist of aluminum, or of an aluminum alloy comprising a high proportion of aluminum. The ceramic substrate 2 can be, without being restricted thereto, for example a DCB substrate (DCB=Direct Copper Bonding) or a DAB substrate (DAB=Direct Aluminum Bonding) or an AMB substrate (AMB=Active Metal Brazing).

One or a plurality of semiconductor chips 25 is/are fixedly connected to the upper substrate metallization 21 in each case by means of a material locking or material bonding realized by a first connection layer 31. In this case, the respective connections can also be electrically conductive, such that the relevant semiconductor chip 25 is electrically connected to the upper substrate metallization 21.

The printed circuit board 4 comprises an arbitrary number of metallization layers 41, 42, 43. Each of said metallization layers 41, 42, 43 can, independently of the configuration of the other metallization layers, be embodied as a continuous metallization layer or else have two or more portions spaced apart from one another. A conductor track having a layer thickness of at least 105 μm can be formed in at least one of the metallization layers 41, 42, 43.

In any case, as in all configurations of the invention, the printed circuit board 4 has a cutout 44 in which the semiconductor chip or semiconductor chips 25 is/are arranged wholly or partly, such that the printed circuit board 4 also performs the function of a housing for the semiconductor chip or semiconductor chips 25. The cutout 44 can be embodied, as illustrated in FIG. 1, as a through opening of the printed circuit board 4. That means that the cutout 44 extends continuously between two opposite sides of the printed circuit board 4.

The printed circuit board 4 can be a conventional printed circuit board comprising a non-ceramic insulation carrier 40. By way of example, the insulating material can comprise e.g. epoxy resin and/or polyimide, or it can consist of epoxy resin and/or polyimide. In principle, however, the insulation carrier 40 could also comprise a ceramic material or consist of a ceramic material. Independently of the type of insulating material, the insulation carrier 40 can optionally also comprise glass fibers embedded into the insulating material, that is to say for example an epoxy resin or a polyimide or a ceramic material. The insulation carrier 40 furthermore has an underside 40b, and a top side 40t opposite to the underside 40b, said top side being spaced apart from the underside 40b in the vertical direction in the completed semiconductor module.

Furthermore, at least one of the metallization layers 41, 42, 43 of the printed circuit board 4 comprises a conductor track having a conductor track projection 411 extending into the cutout 44. One or a plurality of such conductor track projections 411 is/are used to produce a cohesive and electrically conductive connection to the ceramic substrate 2 equipped with one or a plurality of semiconductor chips 25, which is effected by means of a second connection layer 32, and/or by means of welding connections. In this case, the first metallization layer 41 is completely detached from the insulating material in the entire region of each conductor track projection 411. To put it another way, that means that there is a mechanical connection between the first metallization layer 41 and the insulation carrier 40 at none of the conductor track projections.

As a result of the semiconductor chip or semiconductor chips 25 being mounted on a ceramic substrate 2, the heat loss that arises in the semiconductor chip or semiconductor chips 25 can be dissipated via the ceramic substrate 2 in the direction of a heat sink 1. The later mounting of the heat sink 1 on the printed circuit board 4 can be effected with the aid of a connection device, for example one or a plurality of connection screws 77. For this purpose, each of the connection screws 77 is led through a mounting opening 47 formed in the printed circuit board 4 and is screwed into a threaded hole 17 formed in the heat sink 1. Instead of a screw connection, however, the connection between the printed circuit board 4 and the heat sink 1 can be effected by any other connection techniques.

Optionally, the semiconductor module can comprise a driver circuit board 53, which contains a further printed circuit board 5 provided with a population 55. The driver circuit board 53 can serve for electrically driving the semiconductor chip or semiconductor chips 25 mounted on the ceramic substrate 2.

The printed circuit board 4 can furthermore be used to electrically conductively connect a capacitor 9, for example an intermediate circuit capacitor, to the semiconductor chips 25. For this purpose, the intermediate circuit capacitor 9 can have electrical terminals 96 which are embodied as terminal pins and which can be inserted in each case into an electrical terminal opening 46 of the printed circuit board 4. The fixing of the electrical terminals 96 can be effected for example by means of a screw nut 86 that is screwed onto the relevant terminal pin 96.

Instead of being embodied as simple terminal pins, the electrical terminals 96 can also be embodied as screw terminals having screwing openings which are connected in each case by means of a screw that is led both through the screwing opening and through one of the terminal openings 46 and is then screwed to the printed circuit board 4 by means of a screw nut 86.

Such a connection technique is shown for example for an electrical load 6 having a terminal 61 having a screwing opening 65. A connection device 75 is used for producing an electrically conductive connection of the terminal 61 to the printed circuit board 4, which connection device can be embodied as a screw, for example, which is led through the screwing opening 65 and through the terminal opening 45. A screw nut 85 is then screwed onto the connection screw 75, such that the terminal 61 is fixedly connected to the printed circuit board 4.

FIG. 2A again shows the printed circuit board 4 in accordance with FIG. 1, and FIG. 2B shows a plan view of the printed circuit board 4. As is evident from FIGS. 2A and 2B, the printed circuit board 4 can also comprise a plurality, in principle any desired number, of conductor track projections 411, each projecting into the cutout 44. Each of said conductor track projections 411 can subsequently be cohesively and electrically conductively connected to the ceramic substrate 2 equipped with the semiconductor chip or semiconductor chips 25. By virtue of these connections, the equipped ceramic substrate 2 can be both mechanically and electrically connected to the printed circuit board. During the operation of the semiconductor module, different projections 411 can be at different or else at identical electrical potentials, or two or more different projections can be at a first electrical potential, while at least one further projection can be at a second electrical potential, which is different than the first electrical potential.

As is furthermore evident from FIG. 2B, one of the metallization layers 41, 42, 43 of the printed circuit board 4 can have a conductor track 432 which is closed in a ring-shaped fashion and which runs around the cutout 44. Optionally, a surface of the conductor track 432 that is closed in a ring-shaped fashion can be exposed.

Furthermore, the printed circuit board 4 can comprise one or a plurality of conductor tracks 433 which are formed in the same metallization layer or in different metallization layers 41, 42, 43 of the printed circuit board 4 and onto which bonding wires can be bonded later by wire bonding.

Figure 3A:
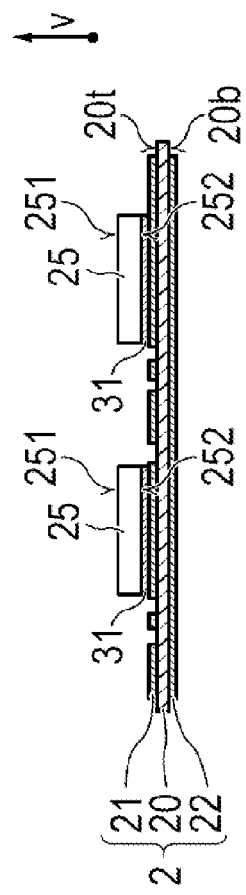
FIG. 3A shows a vertical section through the ceramic substrate equipped with a semiconductor chip.
Figure 3B:
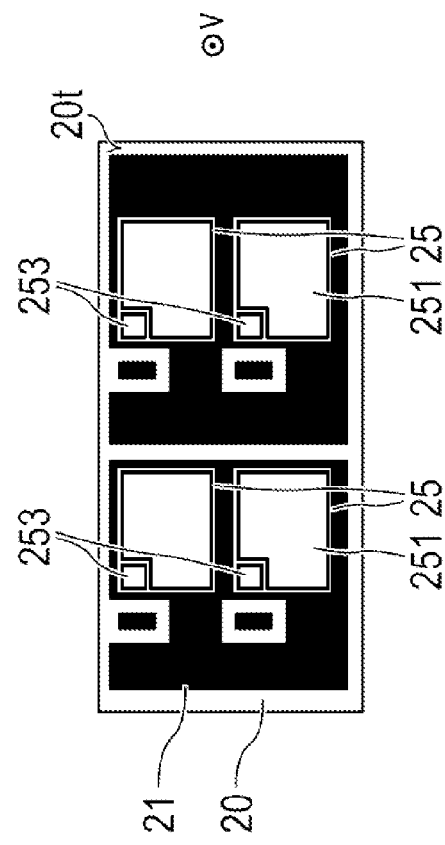
FIG. 3B shows a plan view of the equipped ceramic substrate in accordance with FIG. 3A.

FIG. 3A again shows the ceramic substrate 2 equipped with the semiconductor chip or semiconductor chips 25 in cross section. FIG. 3B shows the arrangement in accordance with FIG. 3A in plan view. Each of the semiconductor chips 25 can optionally be a vertical component, i.e. a component in which the load current flows through the semiconductor chip 25 between mutually opposite sides of its semiconductor body. For this purpose, the semiconductor chip 25 can have a first load terminal 251, which is formed at the top side—facing away from the ceramic substrate 2—of the semiconductor body of the relevant semiconductor chip 25, and a second load terminal 252, which is formed at that side of the semiconductor body of the relevant semiconductor chip 25 which faces the ceramic substrate 2. In the case of such a vertical semiconductor chip 25, the second load terminal 252 is fixedly connected to the upper substrate metallization 21 cohesively and electrically conductively with the aid of the first connection layer 31.

If a semiconductor chip 25 is a controllable semiconductor component, a control terminal 253, for example a gate terminal or a base terminal, can optionally be present. Such a control terminal 253 can be situated, as shown, at that side of the relevant semiconductor chip 25 which faces away from the ceramic substrate 2, alternatively also at that side of the semiconductor chip 25 which faces the ceramic substrate 2.

The circuit realized on the ceramic substrate 2 is arbitrary, in principle. By way of example, the circuit can comprise a half-bridge in which the load paths, for example the drain-source paths, of two or more controllable semiconductor chips 25 are electrically connected in series. A load path in this case is considered to be the electrical path between the first load terminal 251 and the second load terminal 252. The load path can be controlled, e.g. switched on and/or off, in each case via the associated control terminal 253, for example a gate terminal or a base terminal.

Figure 4:
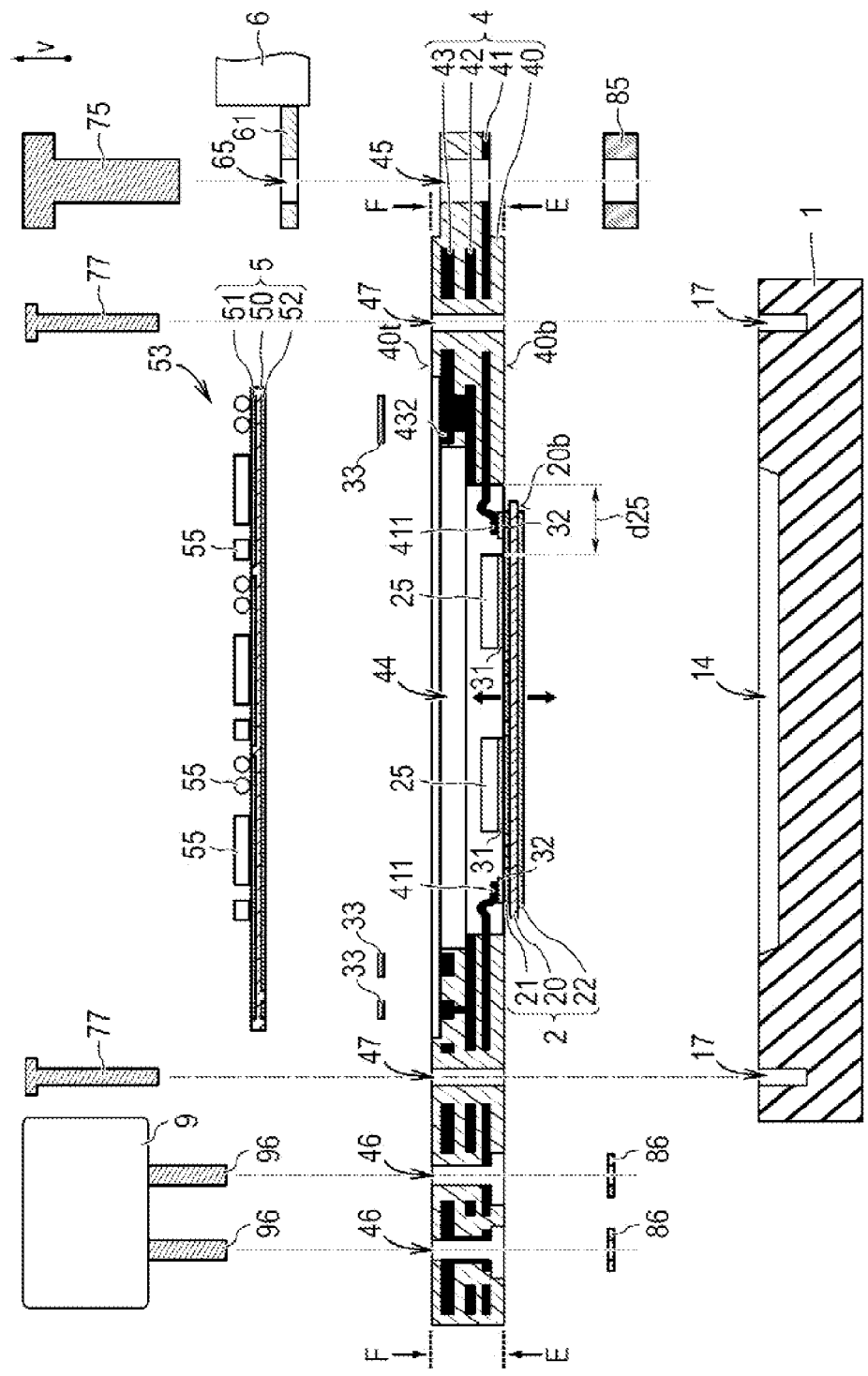
FIG. 4 shows the exploded illustration in accordance with FIG. 1 after the equipped ceramic substrate has been mounted on a conductor track projection of a conductor track of the printed circuit board.

FIG. 4 shows the illustration in accordance with FIG. 1 again, with the difference that the printed circuit board 4 is cohesively and electrically conductively connected to the upper substrate metallization 21 at the conductor track projection or conductor track projections 411 with the aid of the electrically conductive second connection layer 32. In this case, the electrically conductive second connection layer 32 can directly make contact both with the relevant conductor track projection 411 and with the upper substrate metallization 21 after the completion of the electrically conductive connection. As an alternative to the second connection layer 32, the conductor track projection or conductor track projections 411 could in each case also be welded to the upper substrate metallization 21. In this context, it is pointed out that although the upper substrate metallization 21, as illustrated, can be the topmost metallization, this need not necessarily be the case. The expression "upper substrate metallization" merely says that a metallization situated on the top side 20t of the ceramic insulation carrier 20 is involved. Moreover, in the case of two or more conductor track projections 411 and in the case of a ceramic substrate 2 having two or more upper substrate metallizations, there is the possibility of electrically conductively connecting different conductor track projections 411 in each case to a different one of the upper substrate metallizations, namely by any of the connection techniques mentioned (material locking or material bonding by means of connection layer 32 or by welding).

As soon as a composite assembly is present wherein the printed circuit board 4, as explained, is cohesively and electrically conductively connected to the ceramic substrate 2 at the conductor track projection or conductor track projections 411 with the aid of the electrically conductive second connection layer 32 or by welding, the printed circuit board 4, as explained, forms a housing for at least one of the semiconductor chips 25.

That means that the relevant semiconductor chip 25, independently of whether or not the composite assembly is mounted on a heat sink 1, is arranged at least partly, optionally also completely, within the cutout 44 of the printed circuit board 4. If the semiconductor chip 25 is arranged only partly in the cutout 44, a (virtual) plane E-E that runs perpendicularly to the vertical direction v and is applied to the underside 40b of the insulation carrier 40 intersects the semiconductor chip 25. If the semiconductor chip 25 is otherwise arranged completely in the cutout 44, it is situated above said plane E-E in the vertical direction v, and below a (virtual) plane F-F that runs perpendicularly to the vertical direction v and is applied to the top side 40t of the insulation carrier 40.

FIG. 5A again shows the composite assembly already illustrated in FIG. 4, comprising the printed circuit board 4 and the ceramic substrate 2 equipped with the semiconductor chip or semiconductor chips 25. FIG. 5B shows a plan view of the arrangement in accordance with FIG. 5A.

Figure 5A:
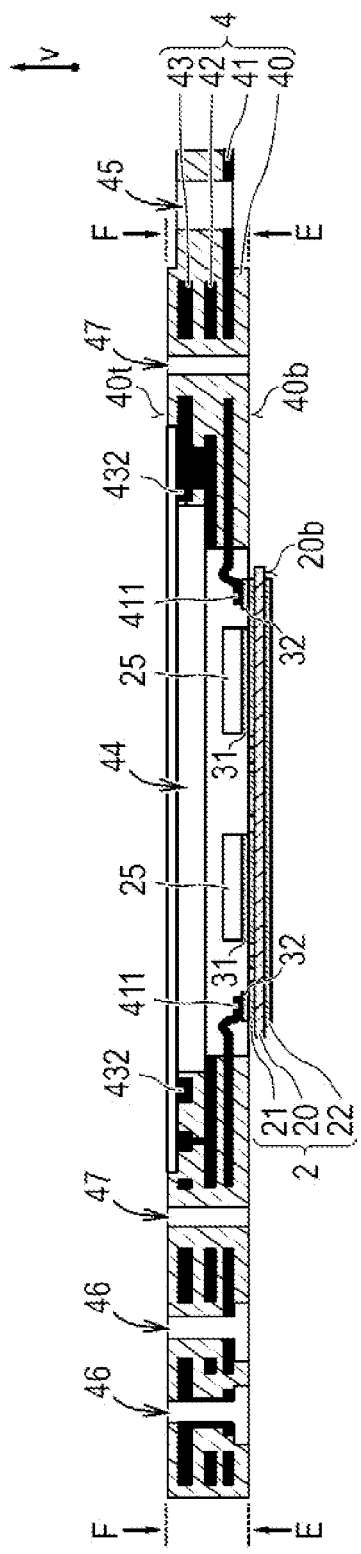
FIG. 5A shows a vertical section through the equipped ceramic substrate cohesively connected to the printed circuit board in accordance with FIG. 4.
Figure 5B:
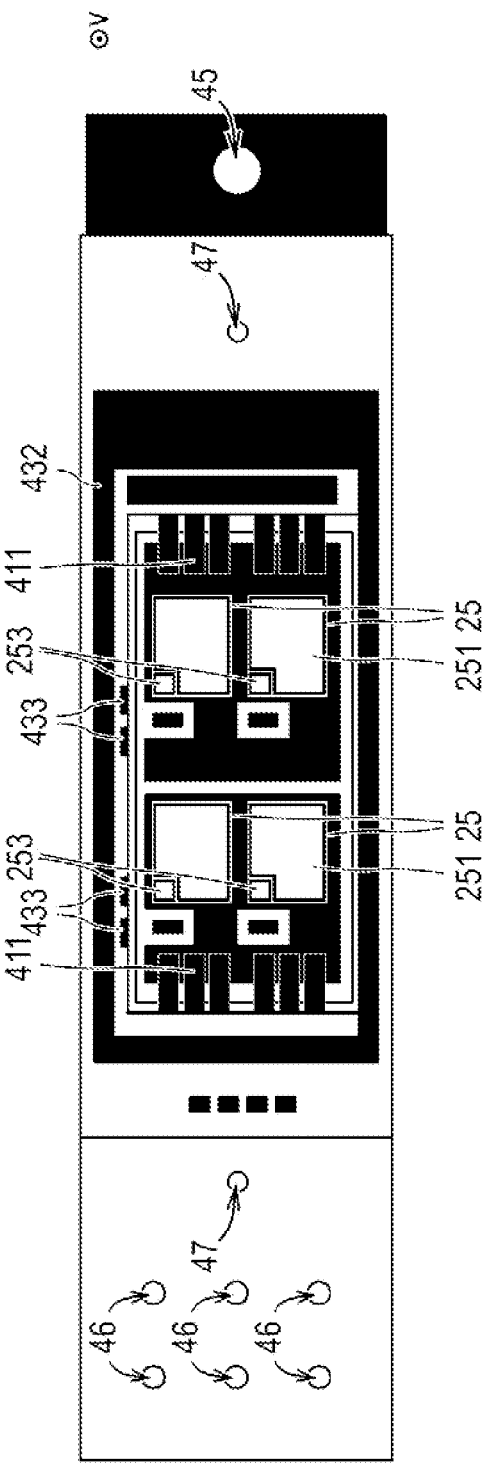
FIG. 5B shows a plan view of the arrangement in accordance with FIG. 5A.
Figure 6A:
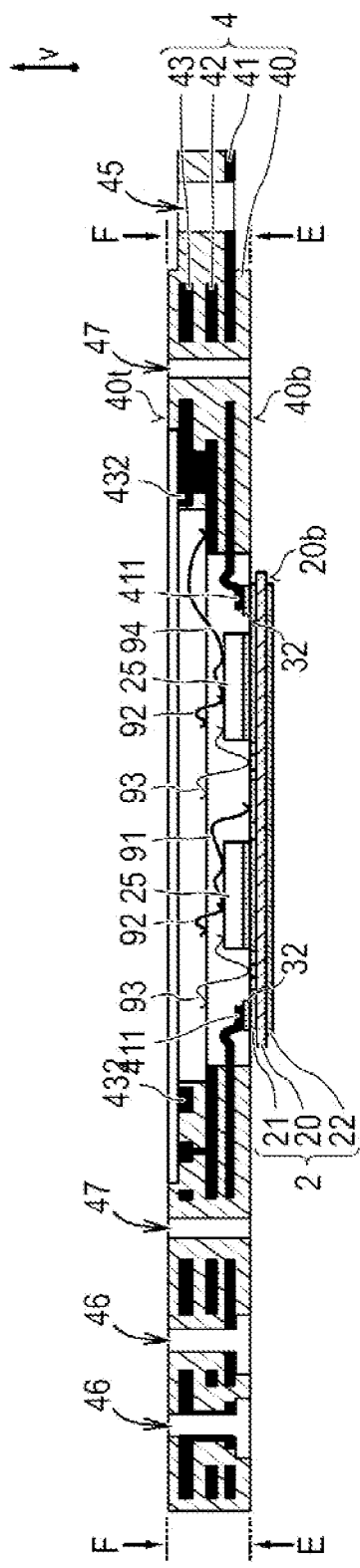
FIG. 6A shows the arrangement in accordance with FIG. 5A after a plurality of bonding wires have been applied, each of which is bonded both onto an upper substrate metallization and onto a metallization layer of the printed circuit board.
Figure 6B:
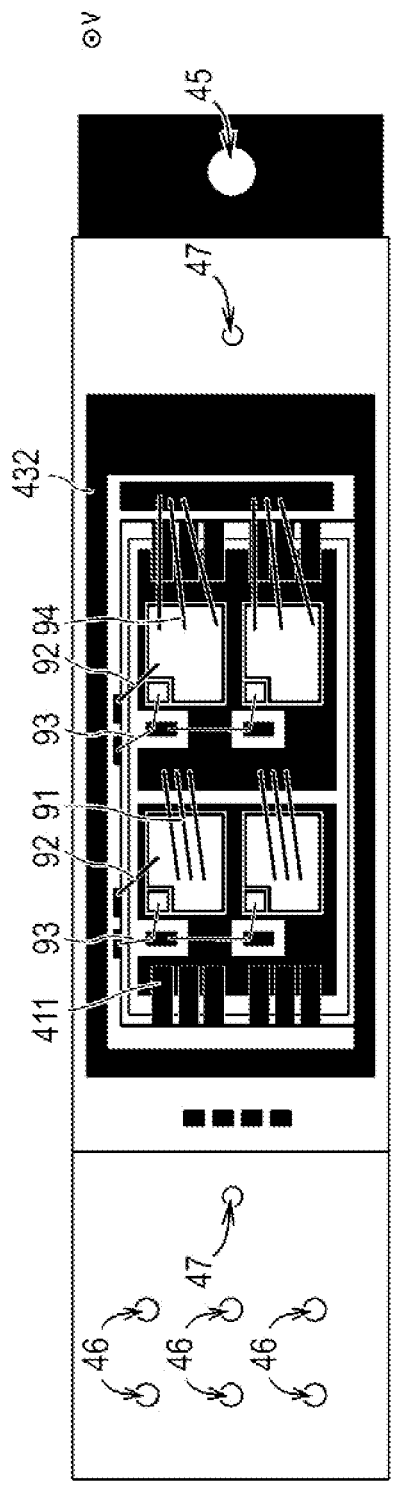
FIG. 6B shows a plan view of the arrangement in accordance with FIG. 6A.

In a further step, the result of which is illustrated in cross section in FIG. 6A and in plan view in FIG. 6B, the arrangement in accordance with FIGS. 5A and 5B can be provided with one or a plurality of bonding wires 92, 93 each of which is bonded at a first bonding location onto a conductor track 433 of the printed circuit board 4 and is bonded at a second bonding location onto a substrate metallization 21 or onto a first load terminal 251 (see FIG. 5B) or onto a control terminal 253 (see FIG. 5B). In this case, "bonding" is taken to mean "wire bonding" wherein the bonding wire 92, 93 is bonded in each case directly onto the relevant conductor track 433 or directly onto the relevant substrate metallization 21 or the first load terminal 251 or the control terminal 253.

Optionally, even further bonding wires 91 can be provided, which are used only for the internal interconnection of the circuit realized on the ceramic substrate 2. The bonding wires 91 therefore have no bonding locations on the printed circuit board 4. Therefore, the bonding wires 91 can be bonded, at any point in time, onto the ceramic substrate 2 equipped with the semiconductor chip or semiconductor chips 25. The bonding of the bonding wires 91 can therefore be carried out before or after the printed circuit board 4 has been connected to the ceramic substrate 2 equipped with the semiconductor chip or semiconductor chips 25 at the conductor track projection or conductor track projections 411 with the aid of the second connection layer 32.

FIG. 7 shows the arrangement in accordance with FIG. 6A after the mounting of the heat sink 1 on the composite assembly comprising the printed circuit board 4, the ceramic substrate 2 equipped with the semiconductor chip or semiconductor chips 25, and the second connection layer 32 with the aid of a connection device 77.

Optionally, the printed circuit board 4 and the heat sink 1 can be adhesively bonded to one another with the aid of an adhesive layer 38. In this case, the adhesive layer 38 can extend continuously from the heat sink 1 as far as the printed circuit board 4. Moreover, the adhesive layer 38 can be embodied as a layer which is closed in a ring-shaped fashion and which surrounds the depression 44 (see FIG. 1) in a ring-shaped fashion. The adhesive layer 38 can serve for mounting or pre-mounting the heat sink 1 on the printed circuit board 4 and/or for sealing a gap between the printed circuit board 4 and the heat sink 1.

As can furthermore be gathered from FIG. 7, the heat sink 1 can optionally have a depression 14, in which the ceramic substrate 2 is arranged completely or at least partly after the mounting of the heat sink 1 on the printed circuit board 4.

As shown in FIG. 8, a potting compound 36 can be filled into the cutout 44, such that the potting compound 36 as a result is arranged at least partly in the cutout 44 and extends from the top side 20*t* of the ceramic insulation carrier 20 as far as over the semiconductor chip or semiconductor chips 25, such that the semiconductor chip or semiconductor chips 25 is/are covered in each case by the potting compound 36 and optionally the bonding wires 91 to 93 are also covered. The potting compound 36 can be for example a gel, e.g. a silicone gel. The potting compound 36 serves for increasing the electrical insulation strength of the semiconductor module. The bonding wires 91, 92, 93 concealed by the potting compound 36 are illustrated by dashed lines in FIG. 8.

As can likewise be gathered from the arrangement in accordance with FIG. 8, the potting compound 36 can also extend as far as the heat sink 1 and make contact therewith.

Figure 9A:
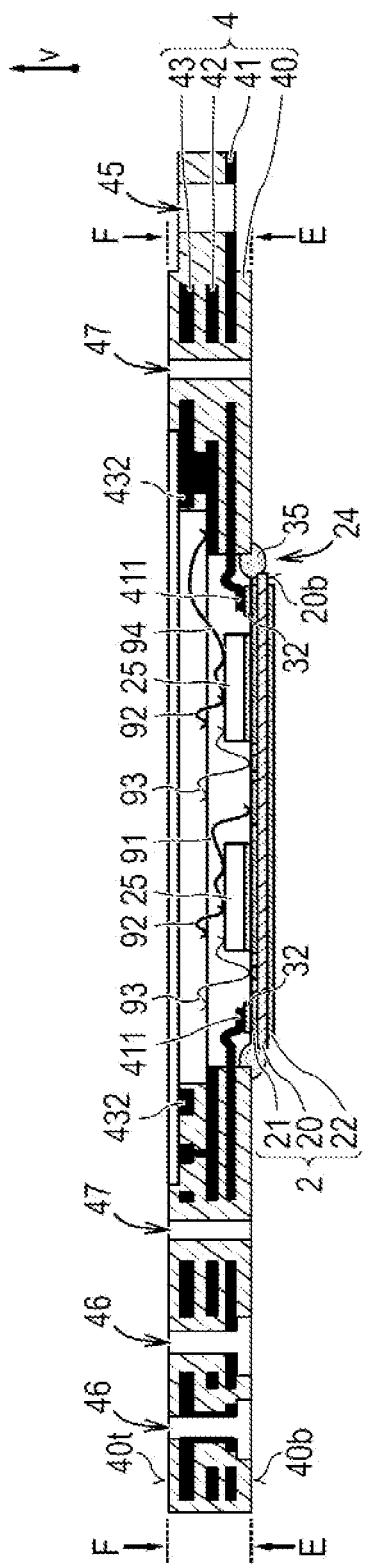
FIG. 9A shows a further exemplary embodiment of a ceramic substrate mounted on a printed circuit board and equipped with one or a plurality of semiconductor chips, wherein a gap between the ceramic substrate and the printed circuit board is sealed by means of an adhesive bead.
Figure 9B:
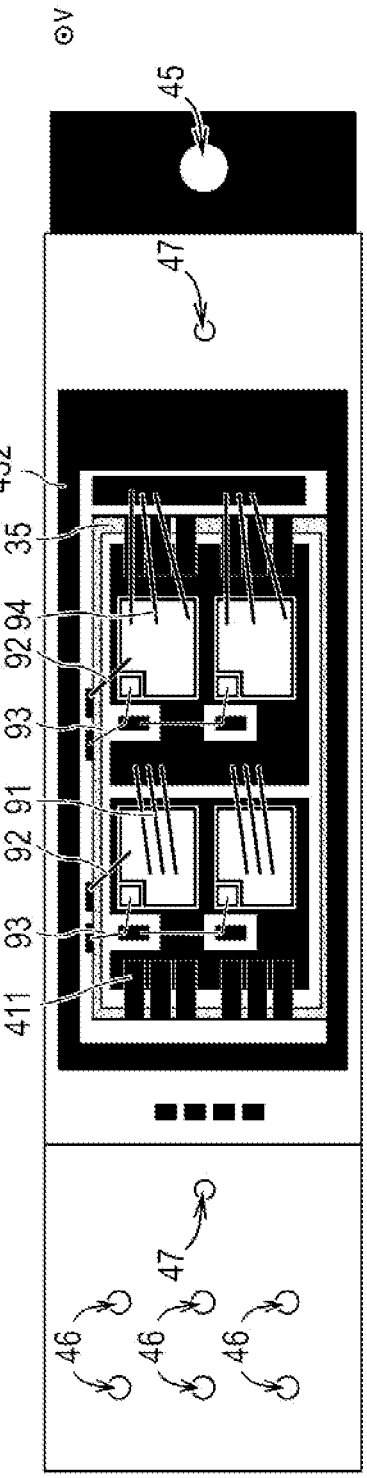
FIG. 9B shows a plan view of the arrangement in accordance with FIG. 9A.

A further exemplary embodiment of a semiconductor module or a semiconductor module arrangement is explained below with reference to FIGS. 9A to 12. In the case of a semiconductor module which is configured in accordance with FIGS. 5A and 5B and which have been produced in the same way as has already been explained with reference to the previous figures, the composite assembly comprising the ceramic substrate 2 equipped with the semiconductor chip or semiconductor chips 25, the printed circuit board 4 and the second connection layer 32 has a gap 24 between the ceramic substrate 2 and the printed circuit board 4. During the subsequent filling of a potting compound 36 into the cutout 44 (see FIG. 1), the potting compound 36 would escape through the gap 24. In order to prevent this, the gap 24 can be sealed with the aid of an adhesive bead 35. In this case, the viscosity of the adhesive from which the adhesive bead 35 is produced is chosen to be high enough that the gap 24 is sealed by adhesive. FIG. 9B shows a plan view of the arrangement in accordance with FIG. 9A.

Figure 10A:
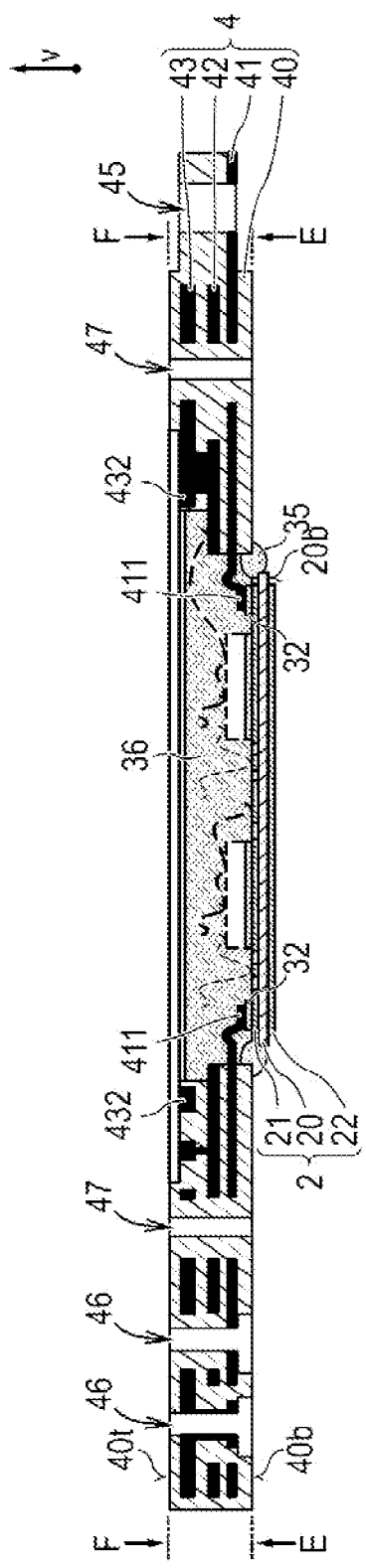
FIG. 10A shows the arrangement in accordance with FIG. 9A after a potting compound has been filled at least into the cutout.
Figure 10B:
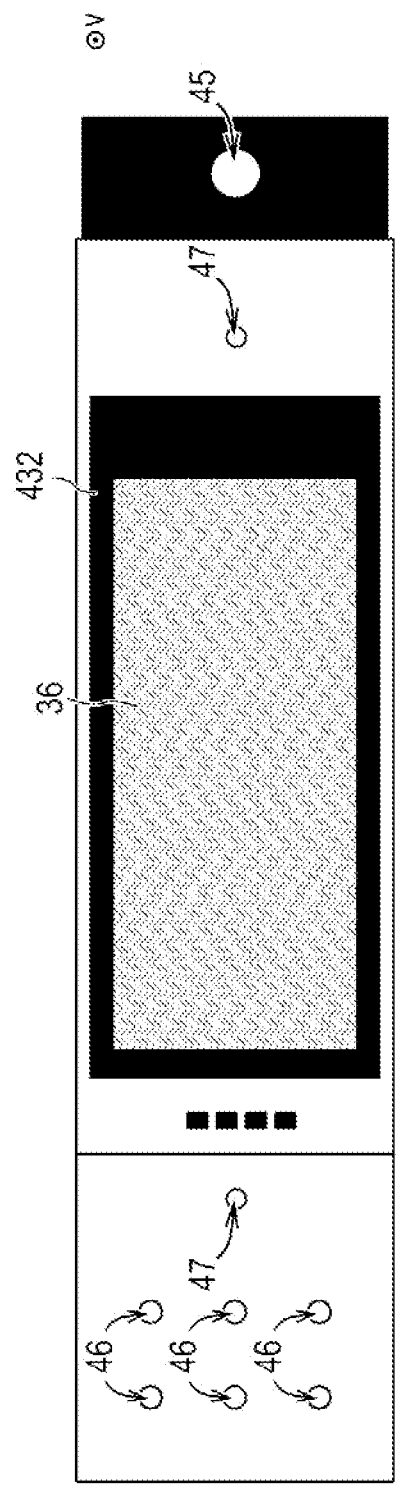
FIG. 10B shows a plan view of the arrangement in accordance with FIG. 10A.

After the production of the adhesive bead 35, a potting compound 36 such as has already been explained can be filled into the cutout 44 (see FIG. 1), the result of which is illustrated in cross section in FIG. 10A and in plan view in FIG. 10B. After the complete filling of the potting compound 36, the latter extends at least from the top side 20*t* of the insulation carrier 20 (see FIG. 1) as far as over the semiconductor chip or semiconductor chips 25. Optionally, all the bonding wires 91, 92, 93 (see FIGS. 9A and 9B), as also in all other configurations of the invention, could also be covered optionally completely by the potting compound 36.

Figure 12:
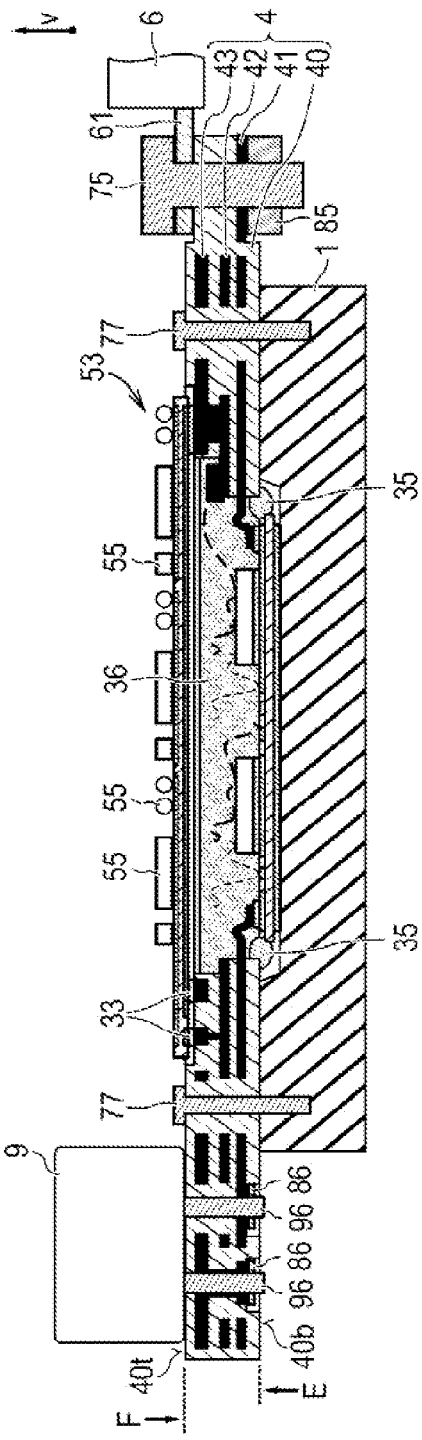
FIG. 12 shows the components illustrated in FIG. 11 after the mounting thereof, and after the mounting of an optional control circuit board above the cutout.

FIG. 11 again shows the semiconductor module in accordance with FIG. 10A in conjunction with further components which can in each case be mounted optionally on the semiconductor module. All of these components have already been explained with reference to FIGS. 1 to 8. They can be fixed to the semiconductor module in the same way. FIG. 12 shows the semiconductor module arrangement after the mounting of the further components on the semiconductor module. Unlike in the case of the semiconductor module in accordance with FIG. 8, the potting compound 36 here does not extend as far as the heat sink 1. However, the potting compound 36 makes contact with the adhesive bead 35.

Figure 13:
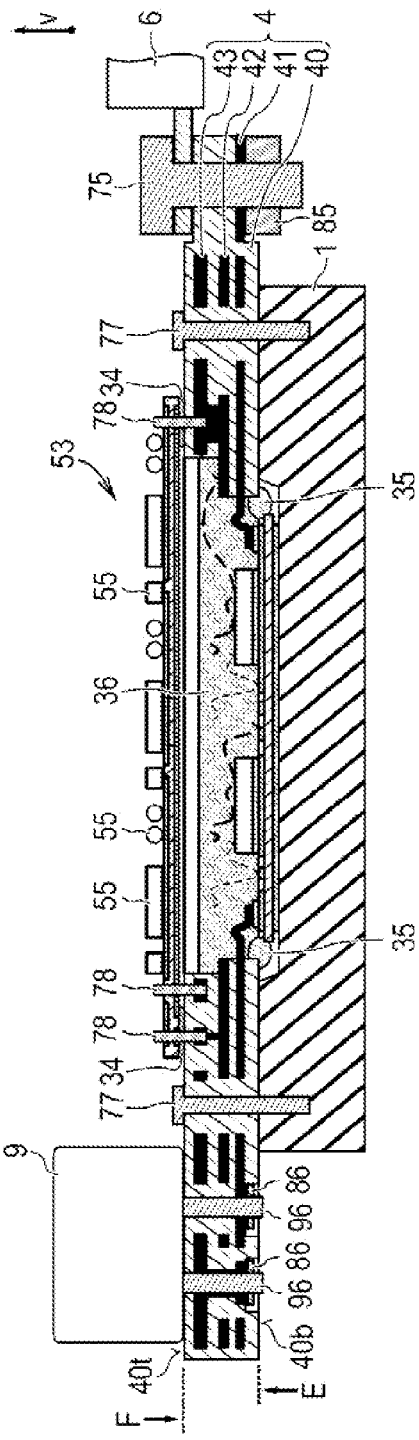
FIG. 13 shows an arrangement which differs from the arrangement in accordance with FIG. 12 in that the control circuit board is fixed to the printed circuit board with the aid of electrical plug connections and is thereby electrically connected to the printed circuit board.

FIG. 13 shows a further exemplary embodiment. The latter differs from the exemplary embodiment in accordance with FIG. 12 in that the optional driver circuit board 53 is electrically connected to the printed circuit board 4 electrically with the aid of plug connectors 78 that are plugged in each case into an opening of the printed circuit board 4 and into an opening of the driver circuit board 53. Furthermore, the driver circuit board 53 can be cohesively connected to the printed circuit board 4 by means of a fourth connection layer 34. In this case, the fourth connection layer 34 can extend continuously from the printed circuit board 4 as far as the driver circuit board 53. The fourth connection layer can be embodied for example as an electrically conductive or electrically insulating adhesive.

Yet another possible configuration of the invention is explained below with reference to FIG. 14. In this case, the cutout 44 (see FIG. 1) is covered with an electrically conductive layer 59 after the production of the material locking or material bonding between the ceramic substrate 2 equipped with the semiconductor chip or semiconductor chips 25 and the printed circuit board 4. Said electrically conductive layer can be a metal layer, for example. The electrically conductive layer 59 can be embodied as a closed layer. It can be connected cohesively by means of a connection layer, which can be produced for example by soldering or by sintering, to one of the metallization layers 41, 42, 43 (here: 43) of the printed circuit board 4, in particular to a ring-shaped conductor track 432. The electrically conductive layer 59 can optionally be connected to ground in order, during the operation of the semiconductor module, to reduce the emission of interference radiation that can be caused in particular by switching processes of the semiconductor chips 25 and the conduction inductances associated therewith. In this case, the arrangement can be configured such that the ceramic substrate 2 is arranged completely between the electrically conductive layer 59 and the heat sink 1, and/or that the electrically conductive layer 59 completely covers the cutout 45 at the top side 4*t* of the printed circuit board 4 facing away from the ceramic substrate 2.

Such an electrically conductive layer 59 can also be present in all the other configurations of the invention, to be precise independently of whether or not an optional driver circuit board 53 is present. If a driver circuit board 53 is provided, the electrically conductive layer 59 can be arranged between it and the ceramic substrate 2. As an alternative to an electrically conductive layer 59 separate from the ceramic substrate 2, the electrically conductive layer 59 can also be provided by a lower substrate metallization 22.

The mounting of the electrically conductive layer 59 on the printed circuit board 4 can be carried out before the potting compound 36 is filled into the cutout 44, but also afterward. In the first-mentioned case, the electrically conductive layer can have a filling opening for filling the potting compound 36 into the cutout 44. Said filling opening can be closed after the filling process.

FIG. 15 shows a further configuration of a semiconductor module. Here a sealing ring 37 is used to seal a gap between the printed circuit board 4 and the heat sink 1. In this case, the sealing ring 37 bears both against the printed circuit board 4 and against the heat sink. During the later process of filling the potting compound 36 into the cutout 44, the sealing ring 37 prevents the potting compound 36 from escaping through the gap 14 existing between the printed circuit board 4 and the heat sink 1. After the potting compound 36 has been filled in, it extends both as far as the heat sink 1 and as far as the sealing ring 37.

In addition, in all configurations of the invention, the potting compound 36, after being filled into the cutout 44, can extend as far as the printed circuit board 4, in particular also as far as the insulating material 40 thereof.

In the case of the configurations in FIGS. 1 to 14, the ceramic substrate 2 was in each case arranged at least partly in a depression 13 of the heat sink 1. However, these configurations can also be realized if the composite assembly comprising the printed circuit board 4 and the ceramic substrate 2 equipped with the semiconductor chip or semiconductor chips 25 is mounted on a planar mounting surface of the heat sink 1. In this case, the ceramic substrate equipped with the semiconductor chip or semiconductor chips 25 can be pressed completely into the cutout 44 during mounting.

In all configurations of the invention, the ceramic substrate 2 can be displaced from its rest position with a small force relative to the printed circuit board 4 counter to a restoring force. In this case, the restoring force can be brought about by the conductor track projections 411 acting as springs, and/or by an adhesive bead 35 that seals a gap 35 between the ceramic substrate 2 and the printed circuit board 4. In all configurations of the invention, a semiconductor module can be configured such that a restoring force of more than 10 N (newtons) and/or of less than 60 N acts on the ceramic substrate 2 if it is deflected by 1 mm in a vertical direction v relative to the printed circuit board 4. In this case, the vertical direction v runs in a direction perpendicular to the underside 20b of the ceramic insulation carrier 20 from the underside 20b to the top side 20t. As a result of compliance with the lower limit of 10 N, the ceramic substrate 2 is pressed onto the heat sink sufficiently strongly during the mounting of the semiconductor module on a heat sink. Compliance with the upper limit of 60 N ensures that the ceramic substrate 2 has a sufficient mobility relative to the printed circuit board 4, such that excessively high mechanical stresses do not occur in the semiconductor module during the mounting thereof on a heat sink.

In order that the printed circuit board 4 does not oppose a movement of the equipped ceramic substrate 2 in the vertical direction v with an excessive high counterforce, it is possible—as is shown by way of example in FIG. 1—for the ceramic insulation carrier 20 to be dimensioned such that, in each horizontal direction r perpendicular to the vertical direction v, it has in each case a width w20 that is less than the width w44 of the cutout 44 in the same horizontal direction r.

Figure 16:
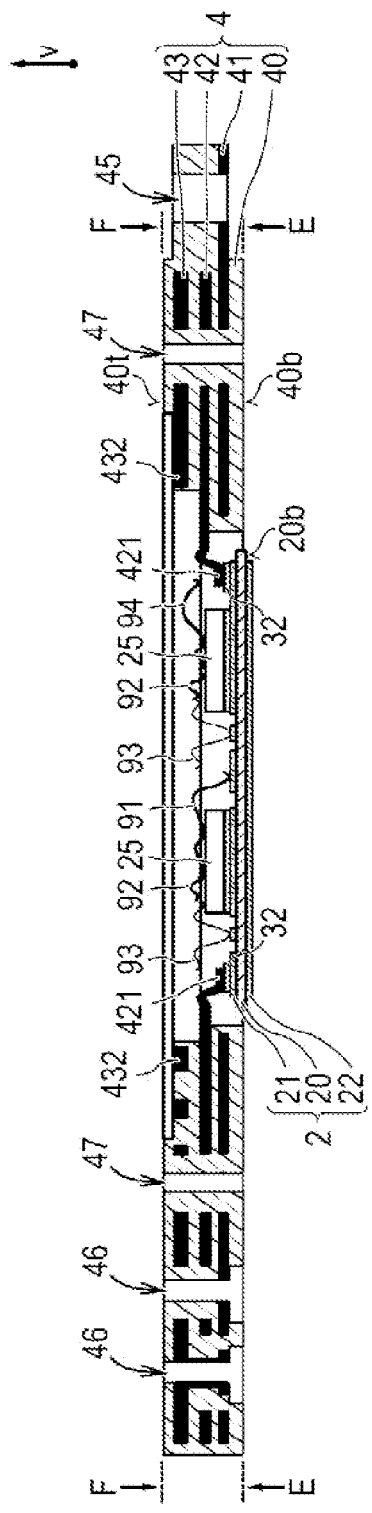
FIG. 16 shows a configuration of a semiconductor module wherein the insulation carrier is arranged partly within the cutout of the printed circuit board.
Figure 17:
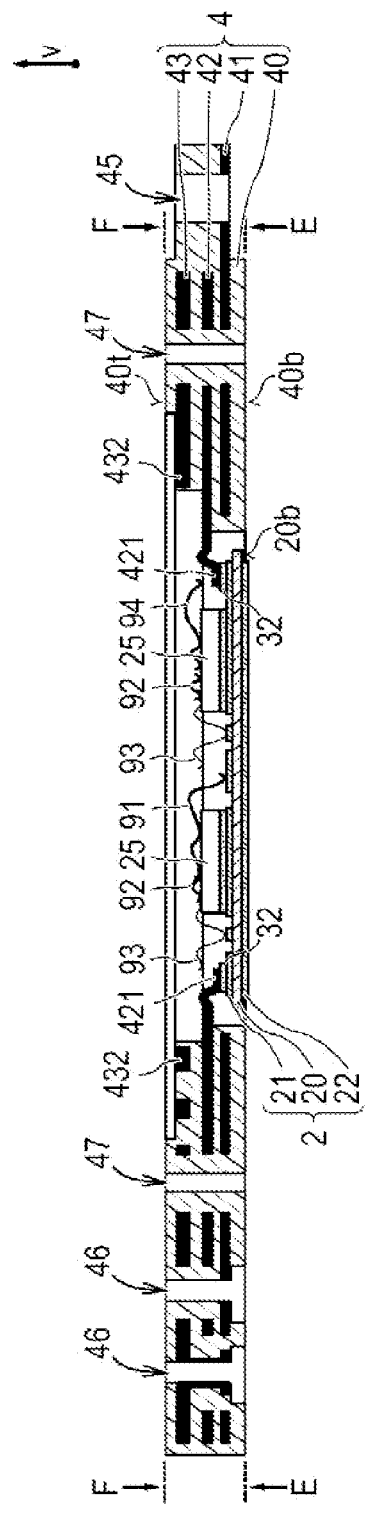
FIG. 17 shows a configuration of a semiconductor module wherein the insulation carrier is arranged completely within the cutout of the printed circuit board.
Figure 18:
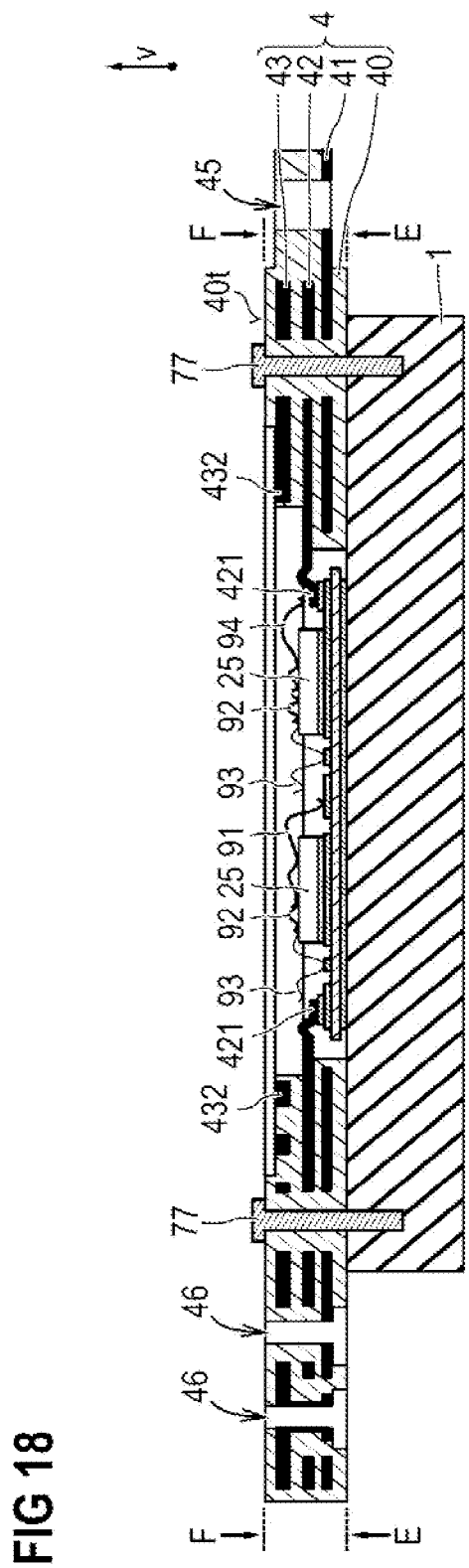
FIG. 18 shows a semiconductor module, embodied in accordance with either of FIGS. 16 and 17, after mounting on a heat sink.

FIG. 16 shows another configuration of a semiconductor module wherein the ceramic insulation carrier 20 is arranged partly in the cutout 44 of the printed circuit board 4, if the semiconductor module has not yet been mounted on a heat sink. FIG. 17 correspondingly shows a configuration of a semiconductor module wherein the ceramic insulation carrier 20 is arranged completely in the cutout 44 of the printed circuit board 4, if the semiconductor module has not yet been mounted on a heat sink. FIG. 18, finally, shows a power semiconductor module configured in accordance with FIG. 16 or 17 after the mounting thereof on a heat sink 1. It can be discerned here that after the ceramic substrate 2 equipped with the semiconductor chip or semiconductor chips 25 has been mounted on a heat sink 1, the ceramic substrate 2 can be situated completely within the cutout 44 of the printed circuit board 4. That means that not only the semiconductor chip or semiconductor chips 25 but also the ceramic substrate 2 is situated above the plane E-E and below the plane F-F in the vertical direction v.

Independently thereof, FIGS. 16 to 18 additionally show that a ceramic substrate 2 equipped with one or a plurality of semiconductor chips 25 can be mounted on conductor track projections 421 of an arbitrary metallization layer 42 of a printed circuit board 4. In any case, the conductor track projection or conductor track projections 421 on which the equipped ceramic substrate 2 is mounted project(s) into the cutout 44 of the printed circuit board 4.

Likewise in all configurations of the invention, at least one, each or all of the semiconductor chips 25 mounted on the ceramic substrate 2 can be at a distance d25 of at least 3 mm from the insulating material 40 of the printed circuit board 4 perpendicularly to the vertical direction v, which is shown by way of example in FIG. 4. This criterion can apply independently of whether or not the semiconductor module is mounted on a heat sink 1.

One advantage of the semiconductor module according to the invention is that, in particular, the printed circuit board 4 serves as a housing for the semiconductor chip or semiconductor chips 25. As a result, the provision of—in addition to the printed circuit board 4—a plastic housing as well, which surrounds the semiconductor chip or semiconductor chips 25 at least in a ring-shaped fashion, can be dispensed with in the case of a semiconductor module according to the invention.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module, comprising:
a printed circuit board comprising an insulating material, a cutout formed in the insulating material, and a first metallization layer, which is partly embedded into the insulating material and which has a conductor track projection projecting into the cutout;
a ceramic substrate comprising a dielectric, ceramic insulation carrier, and an upper substrate metallization, which is applied to a top side of the insulation carrier; and
a semiconductor chip arranged on the upper substrate metallization,
wherein the first metallization layer is mechanically and electrically conductively connected to the upper substrate metallization at the conductor track projection.

2. The semiconductor module of claim 1, wherein the electrically conductive connection between the conductor track projection and the upper substrate metallization is embodied as a material locking or material bonding and is effected by means of an electrically conductive connection layer, which directly makes contact both with the conductor track projection and with the upper substrate metallization.

3. The semiconductor module of claim 2, wherein the connection layer is embodied as a solder layer, or as a layer comprising a sintered metal powder, or as an adhesive layer.

4. The semiconductor module of claim 1, wherein the cutout is embodied as a through opening of the printed circuit board, and wherein the printed circuit board forms a ring-shaped housing surrounding the semiconductor chip.

5. The semiconductor module of claim 1, wherein the top side is spaced apart from the underside in a vertical direction perpendicular to the underside, and wherein the ceramic insulation carrier is dimensioned such that, in each horizontal direction perpendicular to the vertical direction, the ceramic insulation carrier has in each case a width that is less than the width of the cutout in the same horizontal direction.

6. The semiconductor module of claim 1, wherein the ceramic substrate has an underside opposite to the top side, wherein the ceramic substrate has a rest position with respect to the printed circuit board, and wherein a restoring force that is greater than 10 N and/or less than 60 N acts on the ceramic substrate if the latter is deflected by 1 mm relative to the printed circuit board in a vertical direction running perpendicularly to the underside from the underside to the top side.

7. The semiconductor module of claim 1, further comprising a potting compound arranged at least partly in the cutout and which extends from the top side as far as over the semiconductor chip, such that the semiconductor chip is covered by the potting compound.

8. The semiconductor module of claim 7, further comprising a bonding wire which is bonded by wire bonding directly onto a metallization layer of the ceramic substrate and/or directly onto a load terminal of the semiconductor chip, wherein the potting compound extends from the top side as far as over the bonding wire, such that the bonding wire is covered by the potting compound.

9. The semiconductor module of claim 7, wherein the potting compound is a silicone gel.

10. The semiconductor module of claim 7, wherein a gap between the ceramic substrate and the printed circuit board is completely sealed by an adhesive bead closed in a ring-shaped fashion.

11. The semiconductor module of claim 10, wherein the potting compound makes contact with the adhesive bead.

12. The semiconductor module of claim 7, further comprising:
a heat sink; and
a sealing ring, which bears both against the heat sink and against the printed circuit board,
wherein the potting compound makes contact with the sealing ring.

13. The semiconductor module of claim 7, wherein the conductor track projection is embedded into the potting compound.

14. The semiconductor module of claim 7, wherein the potting compound extends as far as the printed circuit board and touches the insulating material.

15. The semiconductor module of claim 1, wherein the semiconductor chip is arranged at least partly or completely in the cutout.

16. The semiconductor module of claim 1, further comprising a bonding wire which is bonded at a first bonding location by wire bonding directly onto a metallization layer of the ceramic substrate or directly onto a load terminal of the semiconductor chip, and is bonded at a second bonding location by wire bonding directly onto a metallization layer of the printed circuit board.

17. A method for producing a semiconductor module, the method comprising:
providing a printed circuit board comprising an insulating material, a cutout formed in the insulating material, and a first metallization layer, which is partly embedded into the insulating material and which comprises a conductor track projection projecting into the cutout;
providing a ceramic substrate comprising a dielectric, ceramic insulation carrier, an upper substrate metallization applied to a top side of the insulation carrier, and said ceramic substrate being equipped with a semiconductor chip arranged on the upper substrate metallization;
producing an electrically conductive connection between the first metallization layer and the upper substrate metallization by means of the first metallization layer being mechanically and electrically conductively connected to the upper substrate metallization at the conductor track projection.

18. The method of claim 17, wherein producing the electrically conductive connection between the first metallization layer and the upper substrate metallization is effected by means of an electrically conductive connection layer which, after the completion of the electrically conductive connection, directly makes contact both with the conductor track projection and with the upper substrate metallization.

19. The method of claim 17, wherein producing the electrically conductive connection between the first metallization layer and the upper substrate metallization is effected by welding, such that the conductor track projection directly makes contact with the upper substrate metallization after the completion of the electrically conductive connection.

20. The method of claim 17, wherein a gap between the ceramic substrate and the printed circuit board is completely sealed by means of an adhesive bead closed in a ring-shaped fashion, and a potting compound is then filled into the cutout in such a way that it extends from the upper substrate metallization as far as over the semiconductor chip, such that the semiconductor chip is covered by the potting compound, wherein the potting compound makes contact with the adhesive bead, and wherein the conductor track projection is embedded into the potting compound.

21. The method of claim 17, further comprising:
arranging a sealing ring between a heat sink and the printed circuit board in such a way that the sealing ring bears both against the heat sink and against the printed circuit board;
filling a potting compound into the cutout, such that:
the potting compound extends from the heat sink as far as over the semiconductor chip and the semiconductor chip is covered by the potting compound;
the potting compound makes contact with the sealing ring; and
the conductor track projection is embedded into the potting compound.

\* \* \* \* \*